United States Patent [19]

Kobayashi

[11] Patent Number: 5,400,029

[45] Date of Patent: Mar. 21, 1995

[54] ANALOG-DIGITAL CONVERSION CIRCUIT DEVICE AND ANALOG-DIGITAL CONVERSION METHOD

[75] Inventor: Kenichi Kobayashi, Tokyo, Japan

[73] Assignee: Seiko Instruments Inc., Japan

[21] Appl. No.: 115,473

[22] Filed: Sep. 1, 1993

[30] Foreign Application Priority Data

Sep. 9, 1992 [JP] Japan .................................. 4.240905

[51] Int. Cl.⁶ .............................................. H03M 1/14
[52] U.S. Cl. .................................................. 341/156
[58] Field of Search ......................................... 341/156

[56] References Cited

U.S. PATENT DOCUMENTS

| | | | |
|---|---|---|---|
| 4,893,124 | 1/1990 | Tsuji et al. | 341/156 |
| 4,918,449 | 4/1990 | Chin | 341/156 |
| 5,184,130 | 2/1993 | Mangelsdorf | 341/156 |
| 5,210,537 | 5/1993 | Mangelsdorf | 341/156 |
| 5,264,851 | 11/1993 | Yasuda | 341/156 X |
| 5,345,237 | 9/1994 | Kouno et al. | 341/156 |

Primary Examiner—Howard L. Williams
Attorney, Agent, or Firm—Adams & Wilks

[57] ABSTRACT

A compact and fast analog-digital conversion circuit device is described.

A coarse analog digital conversion is carried out by a first voltage-dividing circuit 4 and a first voltage comparing circuit block 5. Thereafter, a particular voltage level specified by the coarse conversion is subtracted from an input analog signal Vin held in a sample and hold circuit 2. A result thereof is processed by a second voltage comparing circuit block 10 to effect a fine analog-digital conversion. By such a construction, a number of analog switches contained in a multiplex circuit block 6 can be reduced significantly. Further, compensative reference voltage levels are formed from a second voltage-dividing circuit 9 by an addition/subtraction circuit 11, and a third voltage comparing circuit block 12 is utilized to compare with an output of a subtraction circuit 7 to thereby compensate for error induced between the coarse and fine conversion.

4 Claims, 12 Drawing Sheets

ANALOG-DIGITAL CONVERSION CIRCUIT DEVICE AND ANALOG-DIGITAL CONVERSION METHOD

BACKGROUND OF THE INVENTION

The present invention relates to an analog-digital conversion circuit device and an analog-digital conversion method for converting an analog signal into a digital signal.

Recently with development of digital processing technology as well as micronization and fast performance of a semiconductor integrated circuit, market needs are remakably increased for an analog-digital converter to digitize high frequency analog signal. Conventionally, a serial and parallel structure as shown in FIG. 13 is commonly adopted for the analog-digital converter in digitization of an analog signal in a video frequency range. The serial and parallel type of the analog-digital converter can be built in a semiconductor integrated circuit device with advantages such as cost-down by reduction in chip size and power saving by reduction in numbers of voltage comparators. The conventional analog-digital converter of the serial and parallel type operates such as to sequentially carry out a coarse analog-digital conversion and a fine analog-digital conversion. Firstly, an input analog signal Vin is sampled by a sample and hold circuit (S/H) 102, and is held until completion of a whole analog-digital conversion.

A first voltage-dividing circuit 104 divides a base voltage V into a plurality of coarse reference voltages. A first voltage comparing circuit block 105 includes a plurality of voltage comparing circuits for comparing the input analog signal Vin held by the sample and hold circuit 102, with the respective coarse reference voltages to thereby carry out a first coarse analog-digital conversion. A second voltage-dividing circuit 109 generates a plurality of fine reference voltage levels which are finer than the coarse reference voltage levels. An analog multiplex circuit 115 selects a set of the fine reference voltage levels according to a result of the first coarse analog-digital conversion. A second voltage comparing circuit block 110 includes a plurality of voltage comparing circuits for comparing the input analog signal Vin held in the sample and hold circuit 102, with respective ones of the fine reference voltage levels which are selected partly by the analog multiplex circuit 115 to thereby effect a second fine analog-digital conversion. A logic circuit 113 operates based on results of the first and second analog-digital conversions to produce an output digital signal corresponding to the input analog signal Vin. In case that the input analog signal Vin is close to one of the coarse reference voltage levels, a conversion error may increase due to operating characteristic differences between the voltage comparing circuit used in the first coarse analog-digital conversion and the other voltage comparing circuit used in the second fine analog-digital conversion. For this, normally a range of the fine reference voltage levels selected at the second fine analog-digital conversion is set wider than a pitch of the coarse reference voltage levels. Further, the logic circuit 113 carries out compensation for the conversion error.

FIG. 14 shows an examplified structure in which the conventional analog-digital converter shown in FIG. 13 is built in a semiconductor integrated circuit device. A plurality of resistors R are serially connected between an upper potential VCT and a lower potential VCB of a given base voltage, so as to constitute a first voltage-dividing circuit 104. The first voltage-dividing circuit 104 provides a plurality of coarse reference voltage levels VC1, VC2, . . . , VCN. The respective coarse reference voltage levels are compared to an input analog signal by a first voltage comparing circuit to an input analog signal by a first voltage comparing circuit block (not shown). A result of the comparison is given as selecting signals MD1, MD2, . . . , MDN at respective stages. Another plurality of resistors r are connected serially across a resistor R of each stage, so as to constitute a second voltage-dividing circuit 109. Analog switches are provided in a matrix correspondingly to the individual resistors r, so as to constitute an analog multiplex circuit 115. Every column of the analog switches are commonly connected together to produce a plurality of output signals A-1 - AM+2. Among these, the output signals Ao - Am represent a plurality of fine reference voltage levels which are obtained by dividing one pitch of the coarse reference voltages through the serial resistors r. Further, a pair of output signals A-1 and A-2 represent fine reference voltage levels obtained from a preceding stage, and are used in compensation for the conversion error. The remaining output signals Am+1 and Am+2 represent fine reference voltage levels provided from a succeeding stage, and are likewise used in compensation for the conversion error.

In the conventional analog-digital converter of the serial and parallel type shown in FIGS. 13 and 14, it is necessary to prepare a vast number of fine reference voltage levels according to a resolution of the analog-digital conversion. For example, an eight-bit analog-digital converter requires $2^8 = 256$ steps of the fine reference voltage levels. In the second fine analog-digital conversion, the analog multiplex circuit switchably selects a set of the fine reference voltage levels corresponding to one row of the analog switches. Therefore, the analog multiplex circuit requires a vast number of analog witches corresponding to the resolution steps of 256 in the above mentioned example. The number of analog switches increase exponentially as the resolution is made higher. For example, a ten-bit analog-digital converter of the conventional serial and parallel type requires $2^{10} = 1024$ number of analog switches. In building of such an analog-digital converter as a semiconductor integrated circuit device, there are various problems such as increase in layout area, increase in drive current because a great number of analog switches are switched concurrently, and reduction in conversion speed.

In addition, as shown in FIGS. 13 and 14, a column of analog switches must be provided in a certain number corresponding to a stage number of the first coarse analog-digital conversion, in connection to an input signal line from the analog multiplex circuit 115 to the second voltage comparing circuit block 110. For example, in case that an eight-bit analog-digital conversion is carried out time-dividedly four-bit by four-bit, $2^4 = 16$ number of analog switches are connected to one line. Further, in case that a ten-bit analog-digital conversion is carried out time-dividedly five-bit by five-bit, $2^5 = 32$ number of analog switches are connected commonly to one line, resulting in increase of a load. Consequently, it takes a longer time for a potential of each signal line to reach a saturated constant level during the course of the second fine analog-digital conversion, thereby causing the drawback that the conversion speed may not be raised.

SUMMARY OF THE INVENTION

In order to solve the above noted problems of the prior art, an object of the invention is to provide an analog-digital conversion circuit device which can be built in a semiconductor integrated circuit device, and which features a reduced number of analog switches involved in an analog multiplex circuit, a reduced size, a faster operation speed, and a reduced power consumption.

Several improvements are made in order to achieve the object. According to a first aspect, when the second fine analog-digital conversion is carried out, instead of switching an selecting the fine reference voltage levels stage by stage, a particular voltage level specified by the first coarse analog-digital conversion is subtracted from the input analog signal which is sampled and latched. Then, the subtracted result is compared to a set of fine reference voltage levels by a plurality of voltage comparing circuits. Further, an addition/subtraction circuit is provided to produce compensative reference voltage levels from the original fine reference voltage levels in order to remove an error of the subtraction circuit, and a conversion error due to mismatching between a voltage comparing circuit used in the coarse analog-digital conversion and another voltage comparing circuit used in the fine analog-digital conversion. The output of the subtraction circuit is compared to the compensative reference voltage levels to output a compensated result. By such a manner, a logic circuit produces an output digital signal corresponding to the input analog signal according to those of the first coarse analog-digital conversion result, the second fine analog-digital conversion result, and the compensation result.

According to a second aspect, when the second fine analog-digital conversion is carried out, instead of switching and selecting a set of fine reference voltage levels stage by stage, a certain voltage level specified by the first coarse analog-digital conversion is added to or subtracted from the sampled and held input analog signal so that the input analog signal is processed in analog manner to fall into a range of given fine reference voltage levels. The result of such an addition or subtraction process is compared to the respective fine reference voltage levels to effect a second fine analog-digital conversion. Preferably, the range of the given fine reference voltage levels is set wider than one pitch of the coarse reference voltage levels to enable compensation for conversion error.

By the above described first and second aspects, the analog multiplex circuit simply selects one of the coarse reference voltage levels to feed the selected one to either of the subtraction circuit (in the first aspect) or the addition/subtraction circuit (in the second aspect), hence a number of analog switches in the analog multiplex circuit can be reduced comparably to a bit number assigned to the coarse analog-digital conversion.

DESCRIPTION OF THE PREFERRED EMBODIMENT

Figure 1:
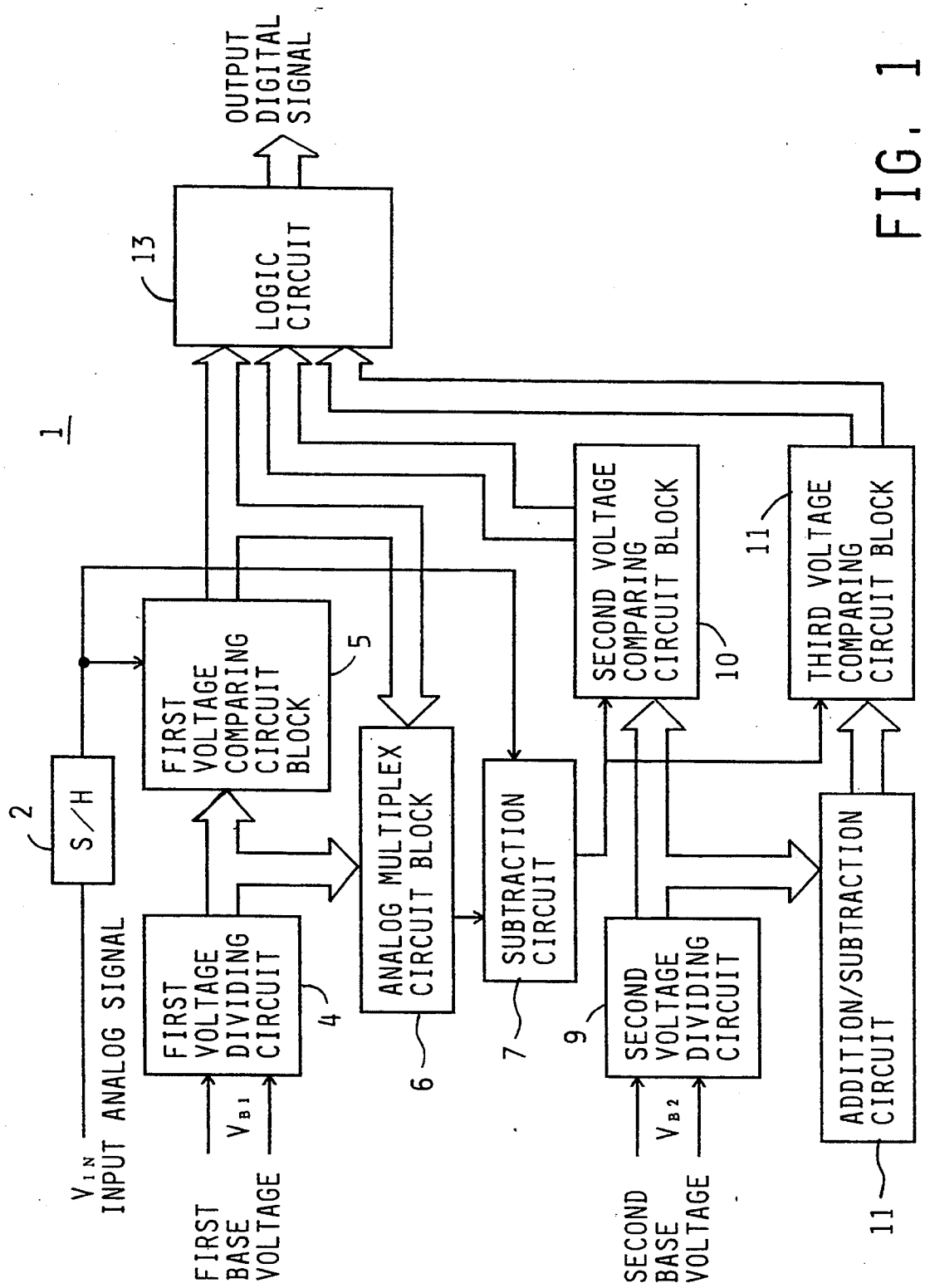
FIG. 1 is a block diagram showing a first embodiment of the inventive analog-digital conversion circuit device.

Hereinafter, preferred embodiments of the present invention will be described in detail with reference to the drawings. FIG. 1 is a block diagram schematically showing a first embodiment of the inventive analog-digital conversion circuit device (A/D converter). As shown in the figure, the A/D converter 1 is provided with a sample and hold circuit (S/H)2 for sampling an input analog signal Vin and for holding the same in a given period. A first voltage-dividing circuit 4 voltage-divides a first base voltage $V_{B1}$ into a plurality of coarse reference voltage levels. The A/D converter 1 further includes a first voltage comparing circuit block 5 which is comprised of a plurality of voltage comparing circuits for comparing an output of the sample and hold circuit 2 with the respective coarse reference voltage levels provided from the first voltage-dividing circuit 4 to thereby coarsely digitize the input analog signal Vin. Hereinafter, such a first coarse analog-digital conversion may be simply called "coarse conversion". An analog multiplex circuit block 6 selects one of the coarse reference voltage levels provided by the first voltage-dividing circuit 4, according to an output of the first voltage comparing circuit block 5. A subtraction circuit 7 is connected to the analog multiplex circuit block 6 for subtracting an output of the analog multiplex circuit block 6 from the output of the sample and hold circuit 2.

The A/D converter further includes a second voltage-dividing circuit 9 for voltage-dividing a second base voltage $V_2$ ref into a plurality of fine reference voltage levels. A second voltage comparing circuit block 10 is comprised of a plurality of voltage comparing circuits for comparing an output of the subtraction circuit 7 with the respective fine reference voltage levels provided by the second voltage-dividing circuit 9, to thereby finely digitize the input analog signal Vin. Hereinafter, such a second fine analog-digital conversion may be simply called "fine conversion". An addition/subtraction circuit 11 is connected to the second voltage-dividing circuit 9 for adding or subtracting at least two of the voltage-divided fine reference voltage levels with one another to thereby produce additional compensative fine reference voltage levels. A third voltage comparing circuit block 12 is comprised of a plurality of voltage comparing circuits for comparing an output of the substraction circuit 7 with another output of the addition/subtraction circuit 11. Lastly, a logic circuit 13 is provided in an output stage for generating an output digital signal corresponding to the input analog signal Vin, according to those outputs of the first voltage comparing circuit block 5, the second voltage comparing circuit block 10 and the third voltage comparing circuit block 12.

In the A/D converter having the above described construction, the input analog signal Vin is converted into the digital signal according to the following analog-digital conversion method. Namely, in a first step, the input analog signal Vin is sampled by the sample and hold circuit 2, and the sampled analog signal Vin is held until the completion of the analog-digital conversion. In a second step, the direct input analog signal or once held input analog signal is compared with the respective coarse reference voltage levels by the first voltage comparing circuit block 5 to carry out the coarse conversion. In a subsequent third step, one of the coarse reference voltage levels is selected by the analog multiplex circuit block 6 according to the result of the coarse conversion. In a fourth step, the selected coarse reference voltage level is subtrated from the input analog signal Vin held in the sample and hold circuit, by means of the subtraction circuit. In a subsequent fifth step, the thus subtracted result is compared by the second voltage comparing circuit block 10 with the respective fine reference voltage levels to thereby effect the fine conversion. Further in a sixth step, at least two levels selected from the fine reference voltage levels are added or subtracted with one another by means of the addition/subtraction circuit 11 to produce compensative fine reference voltage levels. In a seventh step, the previously obtained subtraction result is compared with the respective compensative fine reference voltage levels by the third voltage comparing circuit block 12 to thereby output a result thereof. Lastly in an eighth step, those of the preceding coarse conversion result, the succeeding fine conversion result and the above comparison result are logically processed to obtain the output digital signal corresponding to the input analog signal Vin.

Figure 2:
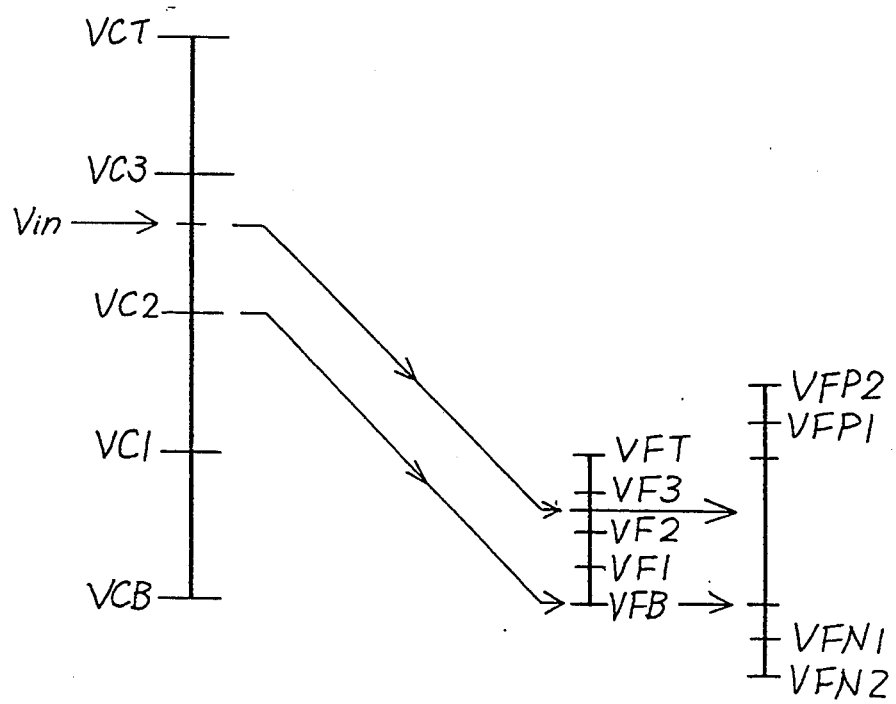
FIG. 2 is a diagram showing a practical example of the inventive analog-digital conversion method.

As understood from the above description, in the analog-digital conversion apparatus and method of the first embodiment, as opposed to the prior art in which the plurality of the fine reference voltage levels are selected switchably stage by stage, the particular reference voltage level specified by the preceding coarse conversion is subtracted from the sampled and held input analog signal Vin so as to utilize the set of the fine reference voltage levels having a fixed range. Further, in order to compensate conversion error due to mismatching between the coarse conversion and the fine conversion, the original fine reference voltage levels are subjected to the addition and subtraction operation thereof to generate the compensive reference voltages. The detailed description of one example will be given with reference to a schematic diagram of FIG. 2. In this diagram, VCT denotes an upper potential level of the first base voltage $V_{B1}$ shown in FIG. 1, and VCB denotes a lower potential level of the same base voltage $V_{B1}$. Further, VC1, VC2 and VC3 denote a plurality of coarse reference voltage levels obtained by the first voltage-dividing circuit 4 shown in FIG. 1. Moreover, VFT denotes an upper potential level of the second base voltage $V_{B2}$ shown in FIG. 1, and VFB denotes a lower potential level of the same base voltage $V_{B2}$. VF1, VF2 and VF3 denote a plurality of fine reference voltage levels obtained by the second voltage-dividing circuit 9 shown in FIG. 1. In the present case, the range of the plural fine reference voltage levels corresponds approximately to one pitch of the coarse reference voltage levels, and VFB has substantially the same level as that of VCB. In addition, VFN1, VFN2, VFP1 and VFP2 denote compensative fine reference voltage levels obtained by the addition/subtraction circuit 11. These compensative reference voltage levels are positioned outside the range of the original fine reference voltage levels to thereby effectively expand the fixed range. In this example, the given input analog signal Vin falls between the coarse reference voltage levels VC3 and VC2. Accordingly, as the result of the preceding coarse conversion, the coarse reference voltage level VC2 i specified by the analog multiplex circuit block 6 shown in FIG. 1. Next, the specified reference voltage level VC2 is subtracted from the input analog signal Vin by the subtraction circuit 7 shown in FIG. 1.

By such a manner, an initial level of the input analog signal is adjusted such as to fall within the range of the fine reference voltage levels to compare with the respective levels VF1, VF2, VF3, VFB and VFT to thereby effect the succeeding fine conversion. Further, in case that the given input analog signal Vin is close to one of the coarse reference voltage levels, conversion error may increase due to mismatching between the voltage comparing circuit for the coarse conversion and the other voltage comparing circuit for the fine conversion, or due to processing error of the subtraction circuit. In view of this, according to this embodiment, the addition/subtraction circuit 11 shown in FIG. 1 is utilized to form the compensative reference voltage levels VFN1, VFN2, VFP1 and VFP2 from the initial set of the fine reference voltage levels.

Figure 3:
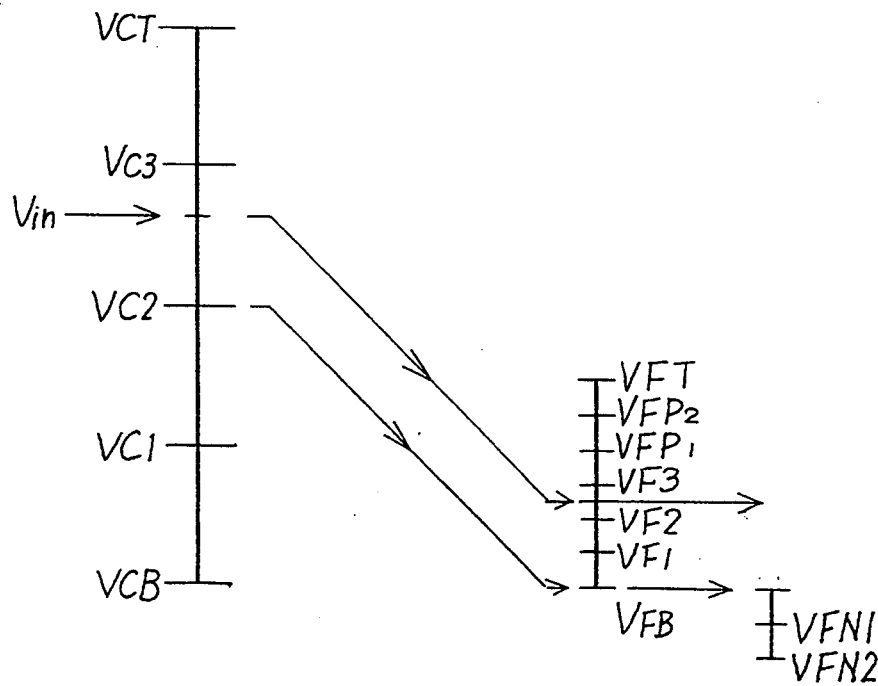
FIG. 3 is a diagram showing another practical example of the analog-digital conversion method.

FIG. 3 shows another example, in which a pair of compensative reference voltage levels VFN1 and VFN2 are provided only at the lower side. With regard to the upper side, the upper potential level VFT of the second base voltage $V_{B2}$ is initially set higher than that of the FIG. 2 example by a certain compensation amount.

Figure 4:
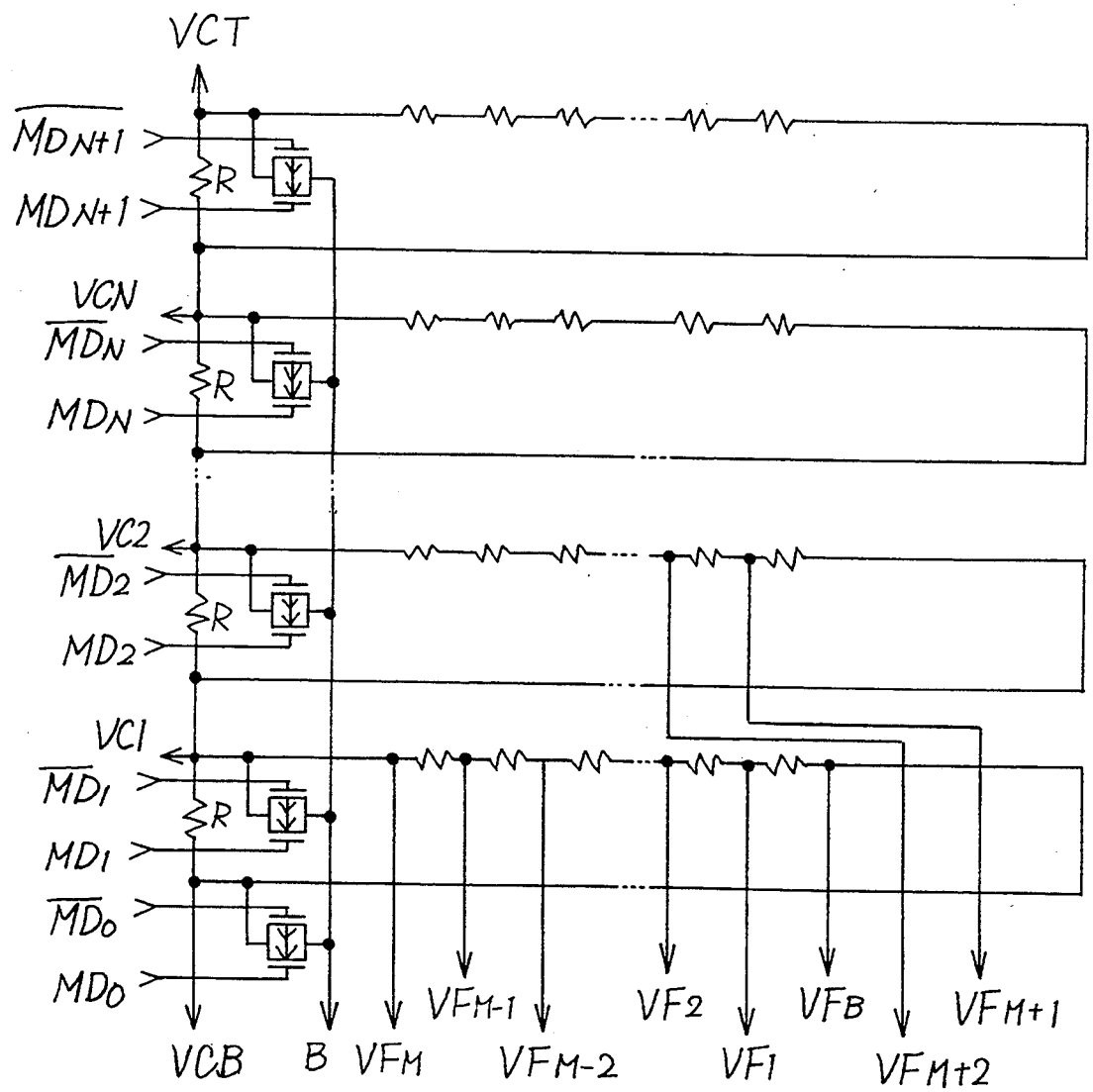
FIG. 4 is a structural diagram showing a detail of the FIG. 1 analog-digital conversion circuit device.
Figure 14:
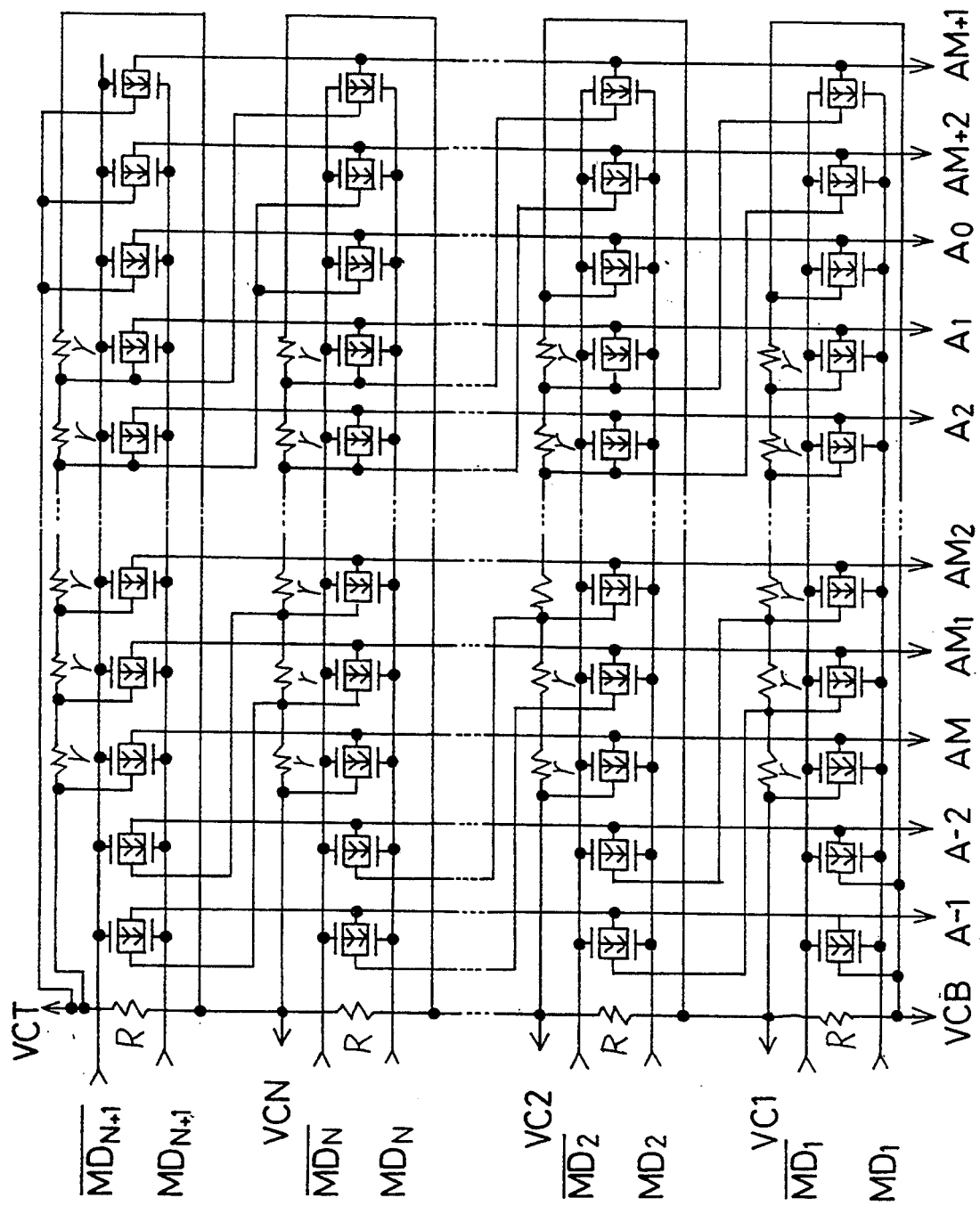
FIG. 14 is a schematic diagram showing a detailed circuit structure of the conventional analog-digital conversion circuit device.

FIG. 4 is a schematic circuit diagram showing a practical embodiment of the inventive A/D converter constructed in the form of a semiconductor integrated circuit device. A plurality of resistors R are serially connected between the upper potential level VCT and the lower potential level VCB of the first base voltage to constitute the first voltage-dividing circuit 4 shown in FIG. 1. The respective stages of the resistor R provide coarse reference voltage levels VC1, VC2, . . . , VCN, which are inputted into the first voltage comparing circuit block (not shown in the figure). Results of the preceding coarse conversion are outputted in the form of selection signals $MD_1$, $MD_2$, . . . , $MD_N$. Analog switches are provided correspondingly to the respective stages of the resistor R to constitute the analog multiplex circuit 6 shown in FIG. 1. As seen from FIG. 4, the number of the analog switches is considerably reduced as compared to the conventional structure shown in FIG. 14. One of the analog switches is turned conductive in response to the selection signal to thereby provide the specified coarse reference voltage level on an output line B of the analog multiplex circuit block. Another plurality of resistors r are serially connected across the lowest stage of the resistor R to constitute the second voltage-dividing circuit 9 shown in FIG. 1. A plurality of fine reference voltage levels VFB, $VF_1$, $VF_2$, ..., $VF_{M-2}$, $VF_{M-1}$, $VF_M$ are provided are provided at one terminals of the individual resistors r. Further, compensative fine reference voltage levels $VF_{M+1}$, $VF_{M+2}$ are provided from additional resistors r connected to the lower second stage.

As described above, the inventive analog-digital conversion apparatus and method in most advantageous if constructed in the form of the semiconductor integrated circuit device. Namely, since the number of the analog switches are significantly reduced as compared to the prior art, a layout dimension can be greatly saved in a semiconductor integrated circuit chip. Particularly, CMOS structure may be advantageously adopted so as to prevent increase in number of analog circuit elements which would affect conversion accuracy and operation speed.

Figure 5:
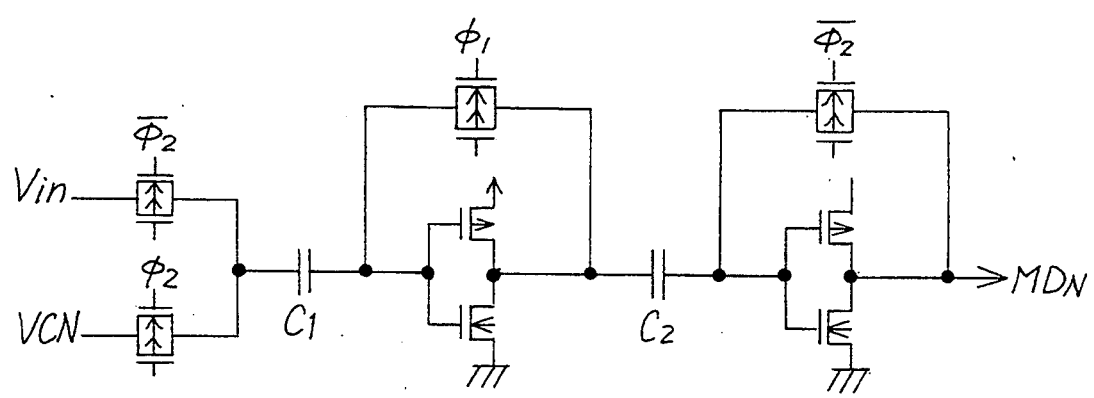
FIG. 5 is a block diagram showing a circuit element of a CMOS structure utilized in the FIG. 1 analog-digital conversion circuit device.
Figure 6:
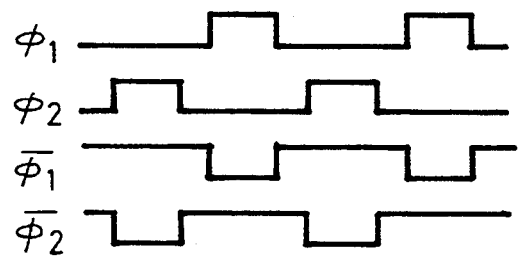
FIG. 6 is a timing chart of the FIG. 5 circuit element.

FIG. 5 shows one example of a voltage comparing circuit having a CMOS structure, and a sample and hold function. This examplified circuit may be adopted to constitute a combination of the sample and hold circuit 2 and first voltage comparing circuit block 5 shown in FIG. 1. In such a case, the sample and hold function of the input analog signal Vin is performed by individual voltage comparing circuits contained in the first voltage comparing circuit block 5. As shown in the figure, this voltage comparing circuit is comprised of a serially connected pair of clocked inverters, which operate in response to clock signals $\phi_1$, $\phi_2$ and their inverted signals as shown in FIG. 6. A capacitive element $C_1$ is interposed between a pair of input terminals and the preceding clocked inverter, and another capacitive element $C_2$ is interposed between the preceding and succeeding clocked inverters. The one input terminal receives the input analog signal Vin, and the other input terminal receives the coarse reference voltage level. For example, when the reference voltage level VCN is inputted, the corresponding selection signal $MD_N$ is outputted. A logic level of the selection signal is inverted according to magnitude relation between the input analog signal Vin and the coarse reference voltage level VCN.

Figure 7:
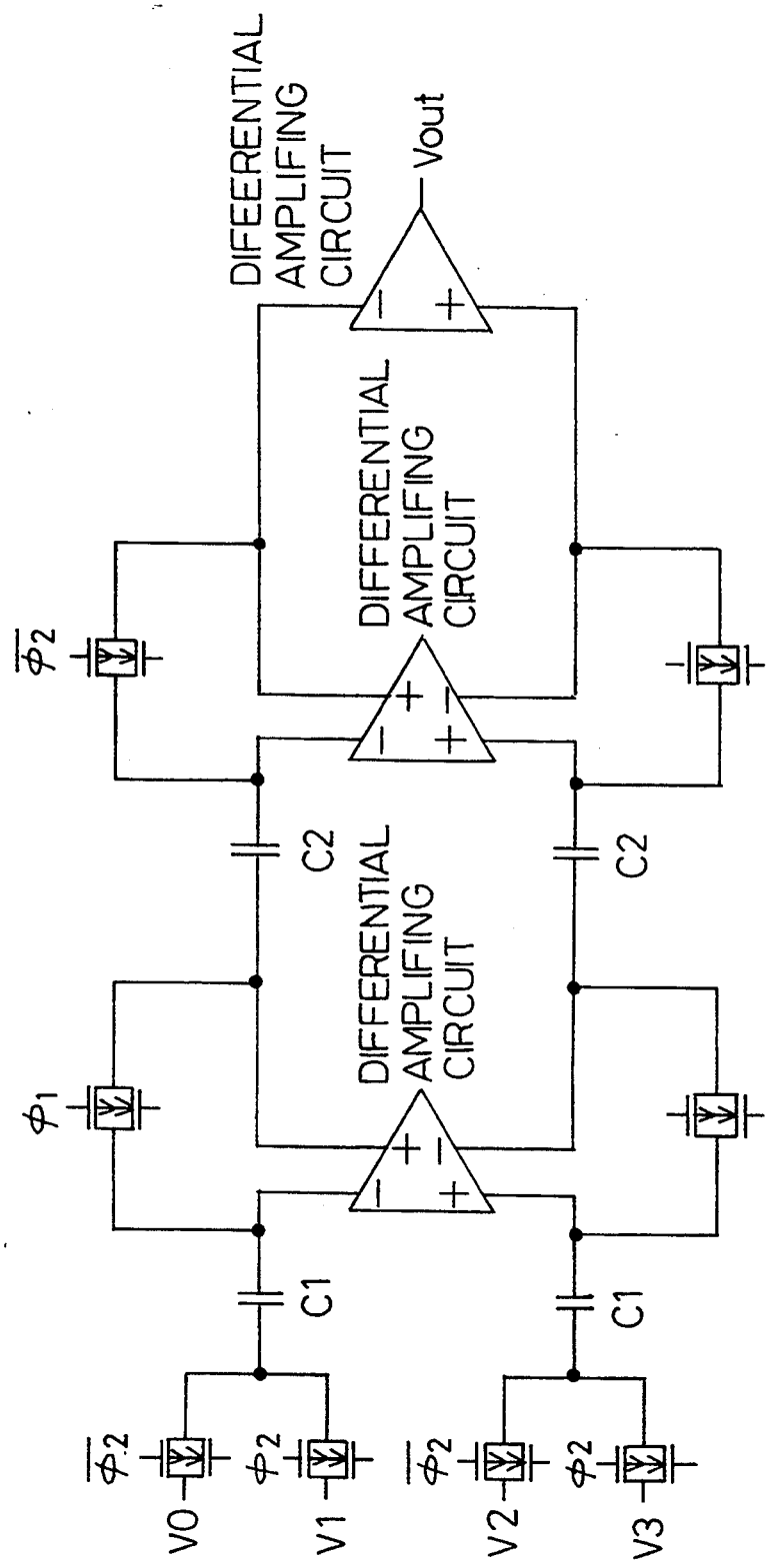
FIG. 7 is a block diagram showing a circuit element of a CMOS structure utilized likewise in construction of the FIG. 1 analog-digital conversion circuit device.

FIG. 7 shows one example of a four-input voltage comparing circuit having the CMOS structure which may be formed in a semiconductor integrated circuit device. This circuit can be adopted to form a set of the subtraction circuit 7, the second voltage comparing circuit block 10, and the sample and hold circuit 2, shown in FIG. 1. As shown in the figure, three differential amplifying circuits are connected in series to one another, which are operated in response to clock signals $\phi_1$, $\phi_2$ and their inverted signals in manner similar to the FIG. 5 circuit. This circuit has an input/output relation represented by Vout=A(V0−V1+V2−V3) where V0, V1, V2 and V3 denote four input voltages, Vout denotes an output voltage, and A denotes a gain. For example, this circuit receives the input analog signal Vin as the first input voltage V0, one of the fine reference voltage levels as the second input voltage V1, the lower potential level of the second base voltage $V_{B2}$ shown in FIG. 1 as the third input voltage V2, and the particular coarse reference voltage level specified by the coarse conversion, thereby automatically carrying out the fine conversion.

In similar manner, the FIG. 7 circuit can be adopted to form a set of the third voltage comparing circuit block 12, the addition/subtraction circuit 11, the subtraction circuit 7, and the sample and hold circuit 2 shown in FIG. 1. Namely, the circuit construction for compensation of the conversion error can be formed of the FIG. 7 circuit. In such a case, the FIG. 7 circuit receives the input analog signal Vin as the input voltage V0, the lower potential level of the second base voltage $V_{B2}$ shown in FIG. 1 as the input voltage V1, and the one coarse reference voltage level specified by the coarse conversion as the input voltage V3. Further, the circuit receives a compensative fine reference voltage level as the input voltage V2. For example, in order to compensate by 1 LSB, the input voltage V2 is set to a compensative fine reference voltage level higher than the lower potential level of the second base voltage $V_{B2}$ by 1 LSB.

The detailed description is given for the operation of the FIG. 7 circuit in conjunction with the FIG. 3 example. As shown in FIG. 3, if the input analog signal is set to Vin, the voltage level specified by the coarse conversion is set to VC2, the lower potential level of the second base voltage $V_{B2}$ is set to VFB, and a voltage level higher than VFB by 1 LSB is set to VF1, the compensative voltage comparing circuit contained in the third voltage comparing circuit block 12 of FIG. 1 produces an output Vout represented by the following relation (1):

$$Vout = A(Vin - VC2 + VF1 - VFB)$$

$$A[(Vin - VC2) - (VFB - VF1)] \quad (1)$$

As understood from the relation (1), the compensation is effected by the voltage level VFN1 shown in FIG. 3. In constructing the first embodiment of FIG. 1 by CMOS, the same circuit structure shown in FIG. 7 can be commonly adopted to form both of the fine conversion structure comprised of the subtraction circuit 7 and the second voltage comparing circuit block 10, and the compensative structure comprised of the third voltage comparing circuit block 12 and the addition/subtraction circuit 11, thereby substantially eliminating structural mismatching between the fine conversion structure and the compensative structure.

As understood from the above description, even if the integrated circuit device is composed of CMOS, the analog multiplex circuit block is utilized only to select one of the coarse reference voltage levels to thereby significantly reduce the number of the analog switches as compared to the prior art. Other analog circuit elements such as voltage comparing circuit, substraction circuit and addition/subtraction circuit are also integrated by CMOS to thereby avoid use of complicated circuit construction.

Figure 8:
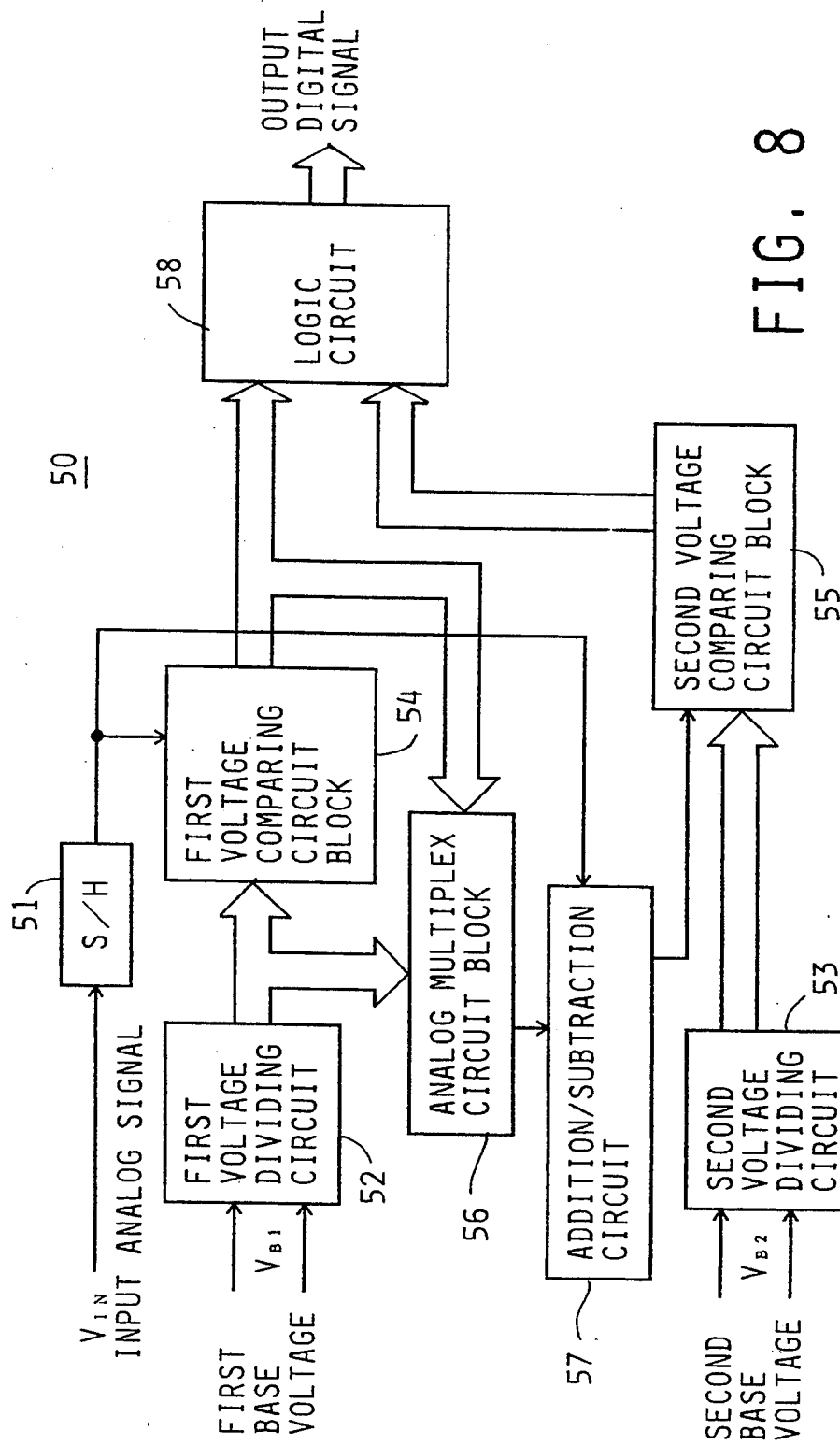
FIG. 8 is a block diagram showing a second embodiment of the inventive analog-digital conversion circuit device.

FIG. 8 is a schematic circuit block diagram showing a second embodiment of the analog-digital conversion circuit device according to the invention. As shown in the figure, an A/D converter 50 is provided with a sample and hold circuit (S/H) 51 for sampling an input analog signal Vin and holding the same for a given period. A first voltage-dividing circuit 52 divides a first base voltage $V_{B1}$ into a plurality of coarse reference voltage levels. Further, a first voltage comparing circuit block 54 contains a plurality of voltage comparing circuits for comparing the input analog signal held by the sample and hold circuit 51 with the respective coarse reference voltage levels divided by the first voltage-dividing circuit 52, thereby effecting course conversion. An analog multiplex circuit block 56 operates according to a result of the coarse conversion to select one of the coarse reference voltage levels from the first voltage-dividing circuit.

An addition/subtraction circuit 57 is connected to the analog multiplex circuit block 56 to carry out addition/subtraction operation between the input analog signal Vin held in the sample and hold circuit 51 and an output from the analog multiplex circuit block 56 to thereby adjust a level of the input analog signal Vin. A second voltage-dividing circuit 53 divides a second base voltage $V_{B2}$ into a plurality of fine reference voltage levels. Preferably, a range of the plural fine reference voltage levels is set wider than one pitch of the coarse reference voltage levels so as to enable compensation for conversion error. A second voltage comparing circuit block 55 is connected to those of the addition/subtraction circuit 57 and the second voltage-dividing circuit 53. This block 55 contains a plurality of voltage comparing circuits for comparing an output of the addition/subtraction circuit 57 with the respective fine reference voltage levels from the second voltage-dividing circuit 53, thereby effecting fine conversion. Lastly, a logic circuit 58 is connected to those of the first voltage comparing circuit block 54 and the second voltage comparing circuit block 55 to generate an output digital signal corresponding to the input analog signal Vin according to results of the preceding coarse conversion and the succeeding fine conversion.

Next, the description is given for analog-digital conversion method executed by the A/D converter 50 of FIG. 8. Initially in a first step, the input analog signal Vin is sample and held by the sample and hold circuit 51 until the completion of the analog-digital conversion of the input analog signal Vin. In a second step, the direct input analog signal Vin or the once held input analog signal Vin is compared with the respective coarse reference voltage levels by means of the first voltage comparing circuit block 54 to thereby carry out the preceding coarse conversion. Subsequently in a third step, one of the coarse reference voltage levels is specified and selected by the analog multiplex circuit block 56 according to the result of the coarse conversion. In a fourth step, the addition or subtraction operation is conducted by the addition/subtraction circuit 57 between the input analog signal Vin held in the sample and hold circuit 51 and the specified coarse reference voltage level selected by the analog multiplex circuit block 56 to thereby carry out the level adjustment of the input analog signal. In a fifth step, the input analog signal adjusted by the addition/subtraction circuit 57 is compared by the second voltage comparing circuit block 55 with the respective fine reference voltage levels which are finer than the coarse reference voltage levels to thereby effect the succeeding fine voversion. Lastly in a sixth step, given logical processing is carried out according to the results of the preceding coarse conversion and the succeeding fine conversion to thereby produce the output digital signal corresponding to the input analog signal.

In the inventive analog-digital conversion apparatus and method of the second embodiment, during the course of the succeeding fine conversion, as opposed to the prior art in which one set of the fine reference voltage levels is switchably selected stage by stage, the input analog signal Vin is subjected to the addition/subtraction operation using the selected voltage level specified by the preceding coarse conversion to effect level adjustment of the input analog signal Vin. Consequently, the adjusted input analog signal falls within the fixed range of the plural fine reference voltage levels to enable the succeeding fine conversion. Various examples of the adjustment process will be described in conjunction with FIGS. 9-11.

Figure 9:
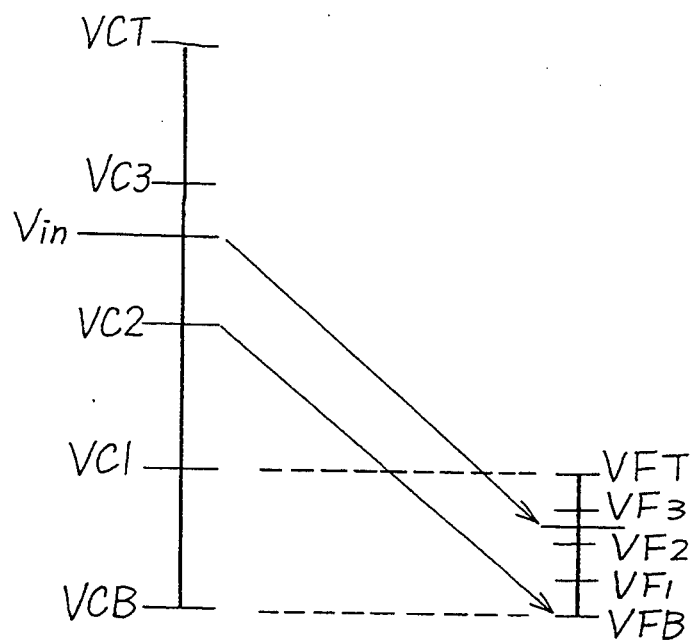
FIG. 9 is a diagram illustrative of the operation of the FIG. 8 embodiment.

In the FIG. 9 example, the input analog signal Vin falls between VC2 and VC3 of the coarse reference voltage levels. Subtraction operation is carried out between the initial input analog signal Vin and the one reference voltage level VC2 specified by the coarse conversion to effect the level adjustment. Consequently, the level-shifted output of the addition/subtraction circuit 57 is placed in the range of the fine reference voltage levels, which is set between an upper potential level VFT and a lower potential level VFB of the second base voltage $V_{B2}$. Accordingly, the succeeding fine conversion can be carried out by using a plurality of fine reference voltage levels VF1, VF2 and VF3. Further, in the FIG. 9 example, if the input analog signal Vin is close to one of the coarse reference voltage levels, an error may be caused between the coarse and fine conversions.

Figure 10:
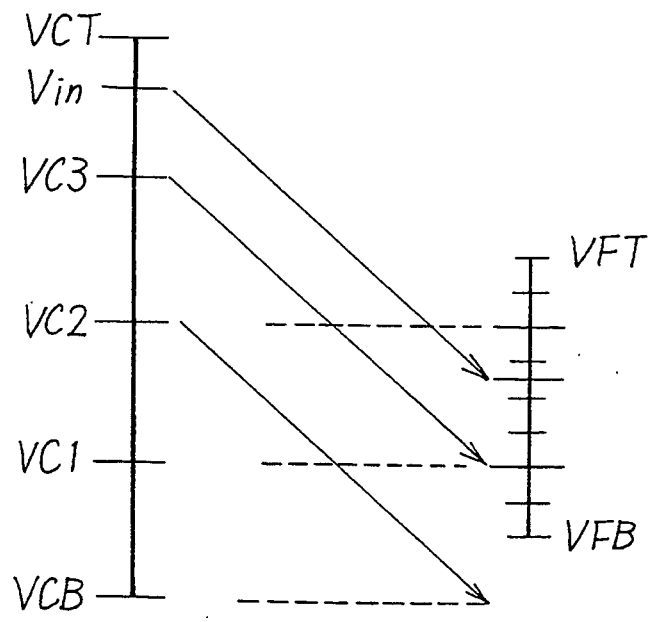
FIG. 10 is a diagram likewise for explanation of the operation.

In order to suppress such a conversion error, according to an example shown in FIG. 10, the range of the fine reference voltage levels is set wider than one pitch of the coarse reference voltage level. In detail, the range of the fine reference voltage levels is expanded upper and lower sides by 2 LSBs. In the FIG. 10 example, the input analog signal Vin falls between the coarse reference voltage levels VC3 and VCT so that the subtraction operation is effected between the input analog signal Vin and the level VC2. Consequently, the differential output which has an adjusted level is placed between VFT and VFB so that the succeeding fine conversion is effected by using the plurality of the fine reference voltage levels set between VFT and VFB.

Figure 11:
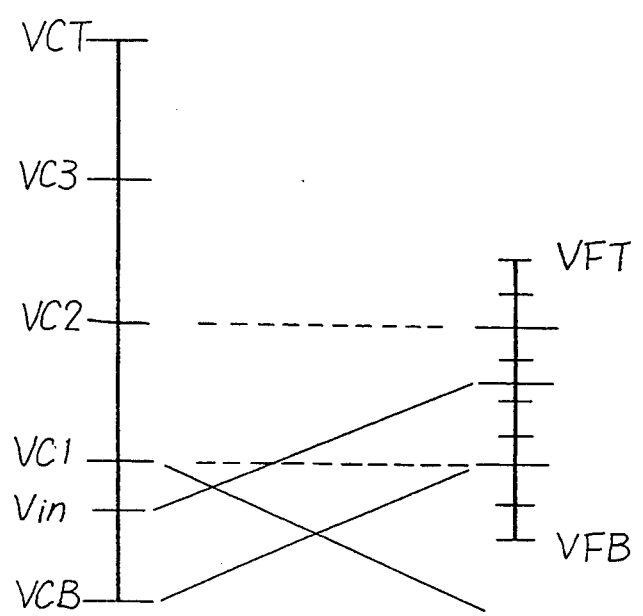
FIG. 11 is likewise a diagram for explanation of the operation.

In a third example shown in FIG. 11, the input analog signal Vin falls between one coarse reference voltage level VC1 and the lower potential level VCB of the first base voltage. In such a case, addition operation is effected between the input analog signal Vin and the reference voltage levels VC1 so that the level-adjusted output voltage is placed between the upper potential level VFT and the lower potential level VFB of the second base voltage in manner similar to the FIG. 10 case. Likewise in this example, the range of the fine reference voltage levels is set broadly to thereby suppress error caused between the coarse and fine conversions.

Figure 12:
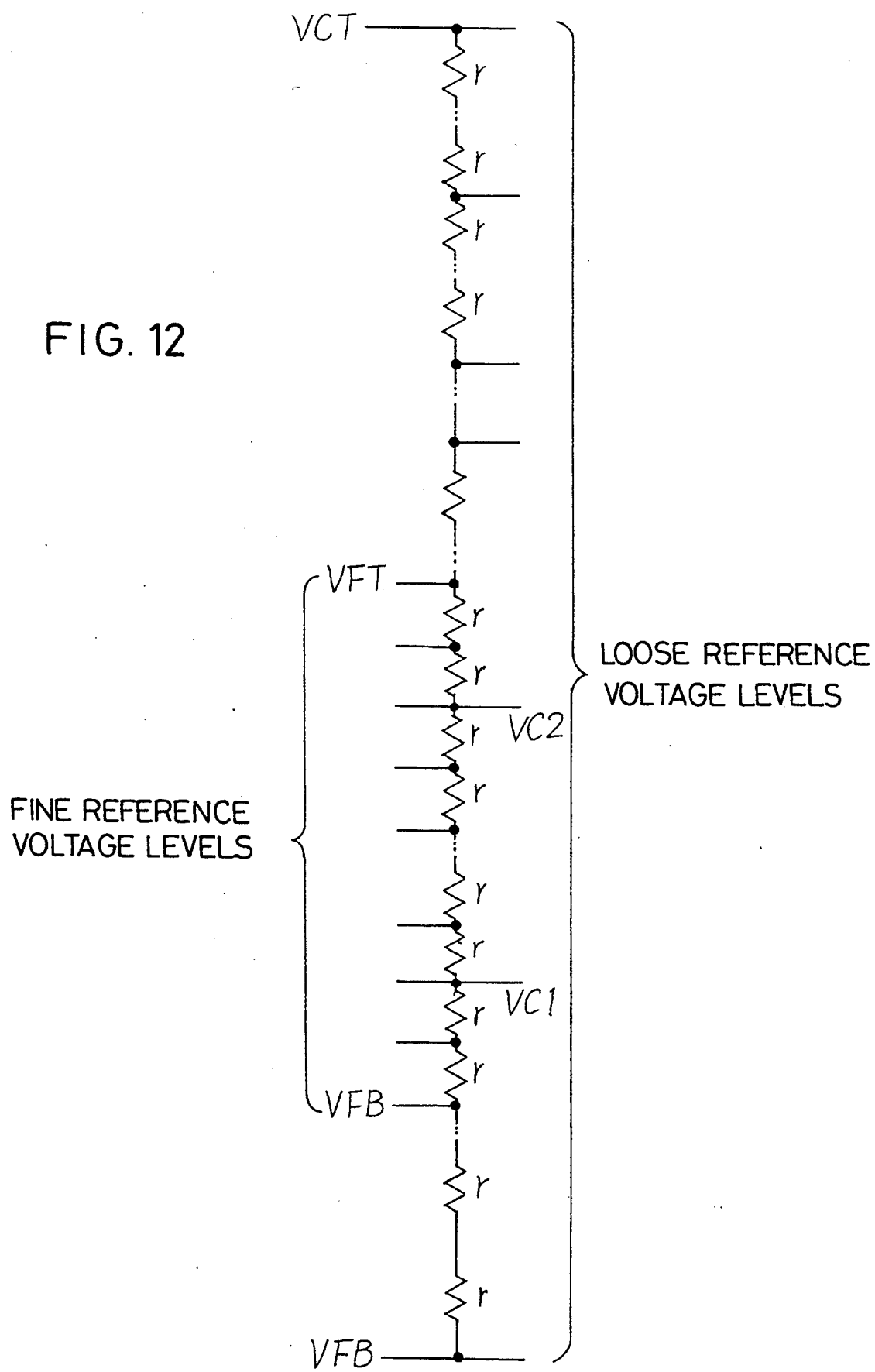
FIG. 12 is a circuit diagram showing one example of a voltage-dividing circuit incorporated into the FIG. 8 embodiment.
Figure 13:
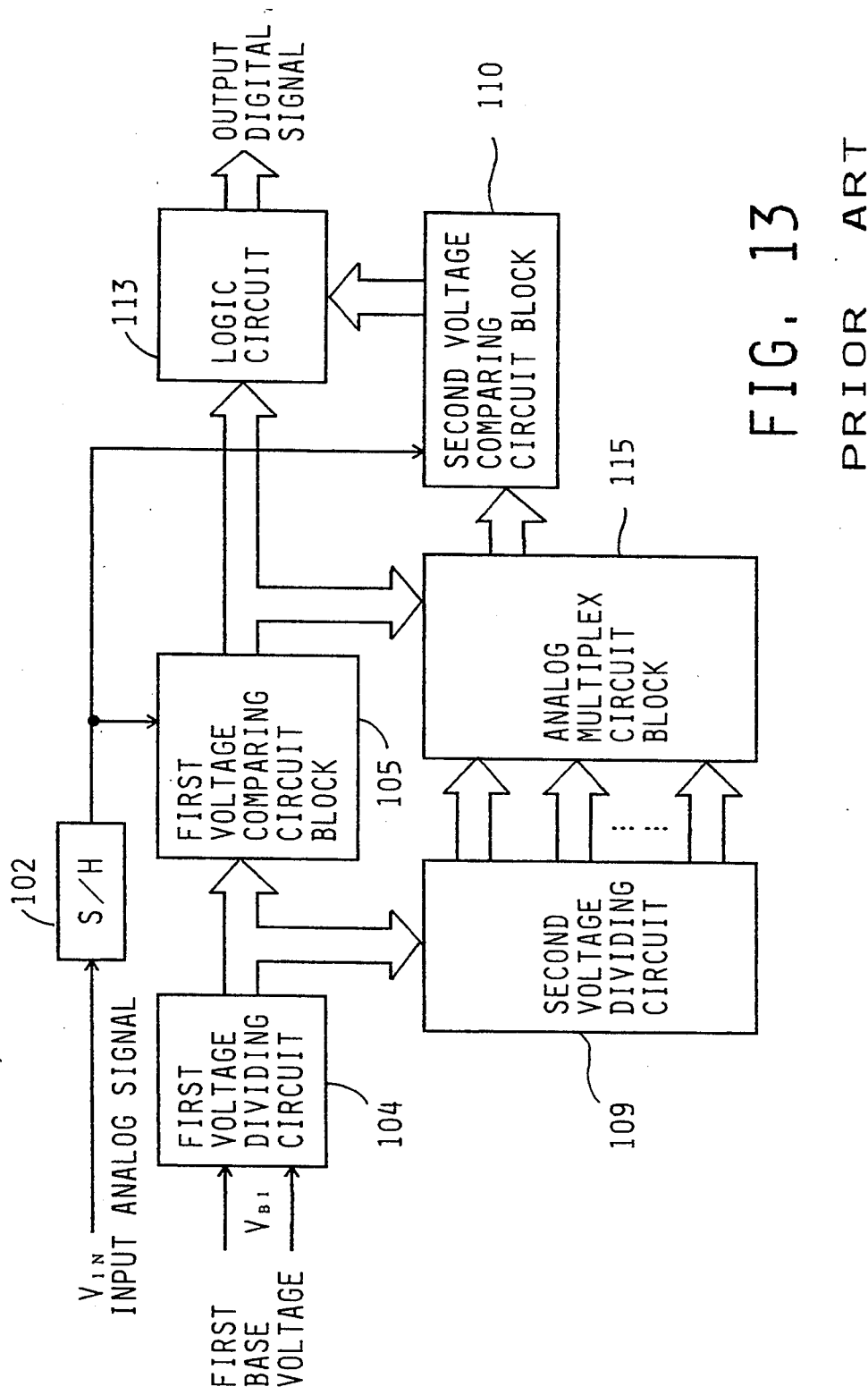
FIG. 13 is a block diagram showing one example of the conventional analog-digital conversion circuit device.

FIG. 12 shows an example of the first voltage-dividing circuit 52 and the second voltage-dividing circuit 53 shown in FIG. 8. A typical resistance division is utilized such that the upper potential level of the base voltage which is supplied externally is set to VCT, and the lower potential level thereof is set to VCB. The base voltage therebetween is divided by a plurality of resistors r so as to produce a plurality of coarse reference voltage levels VC1, VC2, . . . for use in the preceding coarse conversion. On the other hand, respective fine reference voltage levels are produced at one terminals of the individual dividing resistors r. In this embodiment, the range of the fine reference voltage levels, i.e., the voltage between VFT and VFB is set wider than one pitch of the coarse reference voltage levels, e.g., the potential difference between VC1 and VC2 so as to suppress the error induced between the coarse and fine conversions.

In manner similar to the first embodiment of the inventive A/D converter shown in FIG. 1, the second embodiment of the inventive A/D converter shown in FIG. 8 can be also formed into a semiconductor integrated circuit device by using circuit elements of the CMOS structure shown in FIGS. 5 and 7. According to this embodiment, in contrast to the prior art in which the fine reference voltage levels are switched stage by stage, a fixed range of the fine reference voltage levels can be utilized to thereby significantly reduce a number of analog switches as compared to the prior art. Further, faster analog-digital conversion is realized since the inventive structure can eliminate a delay of setting time of the fine reference voltage levels due to a vast load of plural analog switches, which would hinder the analog-digital conversion speed. Further, the addition/subtraction circuit, and the sample and hold circuit may be composed of CMOS elements in compact size to thereby reduce a chip size of the semiconductor integrated device size together with reduction in number of the analog switches.

As described above, according to the invention, in the analog-digital conversion circuit device, the number of the analog switches can be significantly reduced to thereby advantageously contribute to fast operation and scale down of the device. Further, the inventive analog-digital conversion circuit device can be formed into a CMOS semiconductor integrated circuit structure which contains analog circuit elements to thereby advantageously facilitate production of the analog-digital conversion circuit device in the form of the one chip IC having a reduced layout size together with the reduction in the number of the analog switches.

What is claimed is:

1. An analog-digital conversion circuit device comprising:
   a sample and hold circuit for sampling an input analog signal and for holding the same for a given period;
   a first voltage-dividing circuit for dividing a first base voltage into a plurality of coarse reference voltage levels;
   a first voltage comparing circuit block including a plurality of voltage comparing circuits for comparing an output from the sample and hold circuit with the respective coarse reference voltage levels so as to coarsely digitize the input analog signal;
   an analog multiplex circuit block for selecting one of the coarse reference voltage levels according to an output of the first voltage comparing circuit block;
   a subtraction circuit for subtracting an output of the analog multiplex circuit block from the output of the sample and hold circuit;
   a second voltage-dividing circuit for dividing a second base voltage into a plurality of fine reference voltage levels;
   a second voltage comparing circuit block including a plurality of voltage comparing circuits for comparing an output of the subtraction circuit with the respective fine reference voltage levels so as to finely digitize the input analog signal;
   an addition/subtraction circuit for adding or subtracting the fine reference voltage levels with one another to produce fine compensative reference voltage levels;
   a third voltage comparing circuit block including a plurality of voltage comparing circuits for comparing the output of the subtraction circuit with respective outputs of the addition/subtraction circuit; and
   a logic circuit operative based on those outputs of the first, second and third voltage comparing circuit blocks for generating an output digital signal corresponding to the input analog signal.

2. An analog-digital conversion method comprising the steps of:
   (a) sampling an input analog signal to hold the same until completion of analog-digital conversion of the input analog signal;
   (b) comparing the input analog signal with a first plurality of coarse reference voltage levels to effect a first coarse analog-digital conversion;
   (c) selecting one of the first coarse reference voltage levels according to a result of the first coarse analog-digital conversion;
   (d) subtracting the selected coarse voltage level from the held analog signal to output a subtracted result;
   (e) comparing the subtracted result with a second plurality of fine reference voltage levels which are finer than the first plurality of coarse reference voltage levels to effect a second fine analog-digital conversion;
   (f) adding or a subtracting the second fine reference voltage levels with one another to generate a plurality of compensative fine reference voltage levels;
   (g) comparing the subtracted result with the plurality of compensative fine reference voltage levels to output a compared result; and
   (h) providing an output digital signal corresponding to the input analog signal according to those results of the first analog-digital conversion, the second analog-digital conversion, and the compared result.

3. An analog-digital conversion circuit device comprising:
   a sample and hold circuit for sampling an input analog signal and for holding the same for a given period;
   a first voltage-dividing circuit for dividing a first base voltage into a plurality of a coarse reference voltage levels;
   a first voltage comparing circuit block including a plurality of voltage comparing circuits for comparing an output of the sample and hold circuit with the respective coarse reference voltage levels so as to coarsely digitize the input analog signal;
   an analog multiplex circuit block for selecting one of the coarse reference voltage levels according to an output of the first voltage comparing circuit block;
   an addition-subtraction circuit for adding or subtracting the output of the sample and hold circuit with an output of the analog multiplex circuit block;
   a second voltage-dividing circuit for dividing a second base voltage into a plurality of fine reference voltage levels;
   a second voltage comparing circuit block including a plurality of voltage comparing circuits for comparing an output of the addition/subtraction circuit with the respective fine reference voltage levels so as to finely digitize the input analog signal; and
   a logic circuit for generating an output digital signal corresponding to the input analog signal according to those outputs of the first and second voltage comparing circuit blocks.

4. An analog-digital conversion method comprising the steps of:
   (a) sampling an input analog signal to hold the same until completion of analog-digital conversion of the input analog signal;
   (b) comparing the input analog signal with a first plurality of coarse reference voltage levels to effect a first coarse analog-digital conversion;
   (c) selecting one of the first coarse reference voltage levels according to a result of the first analog-digital conversion;
   (d) carrying out addition or subtraction of the held input analog signal with respect to the selected coarse reference voltage level according to a result of the first coarse analog-digital conversion;
   (e) comparing a result of the addition or the subtraction with a second plurality of fine reference voltage levels which are finer than the first plurality of coarse reference voltage levels to effect a second fine analog-digital conversion; and
   (f) providing an output digital signal corresponding to the input analog signal according to those results of the first coarse analog-digital conversion and the second fine analog-digital conversion.

* * * * *